(12) United States Patent
Peng et al.

(10) Patent No.: US 11,488,900 B2
(45) Date of Patent: Nov. 1, 2022

(54) WIRING BOARD WITH INTERPOSER SUBSTRATE SURROUNDED BY UNDERFILL AND EMBEDDED IN MAIN SUBSTRATE AND METHOD OF FABRICATING THE SAME

(71) Applicant: Unimicron Technology Corp., Taoyuan (TW)

(72) Inventors: Yan-Jia Peng, Taoyuan (TW); Kuo-Ching Chen, Taoyuan (TW); Pu-Ju Lin, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/232,109

(22) Filed: Apr. 15, 2021

(65) Prior Publication Data
US 2022/0285255 A1  Sep. 8, 2022

(30) Foreign Application Priority Data

Mar. 8, 2021 (TW) ................................. 110108111

(51) Int. Cl.
| | |
|---|---|
| *H01L 23/498* | (2006.01) |
| *H05K 3/46* | (2006.01) |
| *H01L 23/12* | (2006.01) |
| *H01L 23/528* | (2006.01) |
| *H01L 21/768* | (2006.01) |
| *H01L 23/16* | (2006.01) |
| *H01L 23/00* | (2006.01) |
| *H01L 21/50* | (2006.01) |
| *H01L 23/532* | (2006.01) |

(52) U.S. Cl.
CPC ........ *H01L 23/49822* (2013.01); *H01L 21/50* (2013.01); *H01L 21/768* (2013.01); *H01L 23/12* (2013.01); *H01L 23/16* (2013.01); *H01L 23/528* (2013.01); *H01L 23/53228* (2013.01); *H01L 24/14* (2013.01); *H05K 3/4694* (2013.01)

(58) Field of Classification Search
CPC .. H01L 23/49822; H01L 21/50; H01L 23/528
USPC ........................................................ 257/762
See application file for complete search history.

(56) References Cited

U.S. PATENT DOCUMENTS

| | | | |
|---|---|---|---|
| 9,806,061 B2 | 10/2017 | Shen | |
| 2014/0264811 A1* | 9/2014 | Wu | ........................ H01L 25/105 |
| | | | 438/109 |
| 2017/0098627 A1* | 4/2017 | Das | ......................... H01L 24/05 |

FOREIGN PATENT DOCUMENTS

| | | |
|---|---|---|
| TW | 201309123 A | 2/2013 |
| TW | 201513280 A | 4/2015 |

(Continued)

*Primary Examiner* — Quoc D Hoang
(74) *Attorney, Agent, or Firm* — CKC & Partners Co, LLC

(57) ABSTRACT

A method of fabricating a wiring board with an embedded interposer substrate includes preparing a main substrate, forming a recess on the main substrate, placing an interposer substrate into the recess, electrically connecting a second pad of the interposer substrate and the first pad of the main substrate, and filling a gap between the interposer substrate and the main substrate with an underfill. The recess exposes a first pad of the main substrate. A second pad of interposer substrate and the first pad of the main substrate are made of the same metal and formed in different outer surface profiles. The underfill entirely touches side surfaces and a bottom surface of the interposer substrate.

20 Claims, 9 Drawing Sheets

(56) References Cited

FOREIGN PATENT DOCUMENTS

| TW | I578458 B | 4/2017 |
|---|---|---|
| TW | 202022926 A | 6/2020 |

\* cited by examiner

WIRING BOARD WITH INTERPOSER SUBSTRATE SURROUNDED BY UNDERFILL AND EMBEDDED IN MAIN SUBSTRATE AND METHOD OF FABRICATING THE SAME

CROSS-REFERENCE TO RELATED APPLICATION

This application claims priority to Taiwan Application Serial Number 110108111 filed Mar. 8, 2021, which is herein incorporated by reference in its entirety.

BACKGROUND

Field of Invention

The present disclosure relates to a wiring board. More particularly, the present disclosure relates to the wiring board with an embedded interposer and a method of fabricating the same.

Description of Related Art

Various materials are applied in a semiconductor package. Due to a mismatch of coefficient of thermal expansion (CTE) among the various materials, a thermal stresses induced by a later thermal process such as reflow process causes warpage. Reliability of the semiconductor package is subject to warpage.

SUMMARY

The disclosure provides a method of fabricating a wiring board with an embedded interposer substrate. The method includes preparing a main substrate and forming a recess on the main substrate. A first pad of the main substrate is exposed in the recess. The method further includes placing an interposer substrate into the recess. A second pad of the interposer substrate and the first pad are made of the same metal and formed in different outer surface profiles. The method further includes electrically connecting the second pad of the interposer substrate and the first pad of the main substrate. The method further includes filling a gap between the interposer substrate and the main substrate with an underfill. The underfill entirely touches side surfaces and a bottom surface of the interposer substrate.

The disclosure provides a wiring board with an embedded interposer substrate. The wiring board includes a main substrate having a recess formed on the main substrate, and an interposer substrate placed into the recess. The interposer substrate has a bottom surface and a plurality of side surfaces. The wiring board further includes a conductive bonding element between the main substrate and the interposer substrate. The conductive bonding element electrically connects the main substrate and the interposer substrate. The wiring board further includes an underfill between the main substrate and the interposer substrate. The underfill entirely touches side surfaces and a bottom surface of the interposer substrate.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
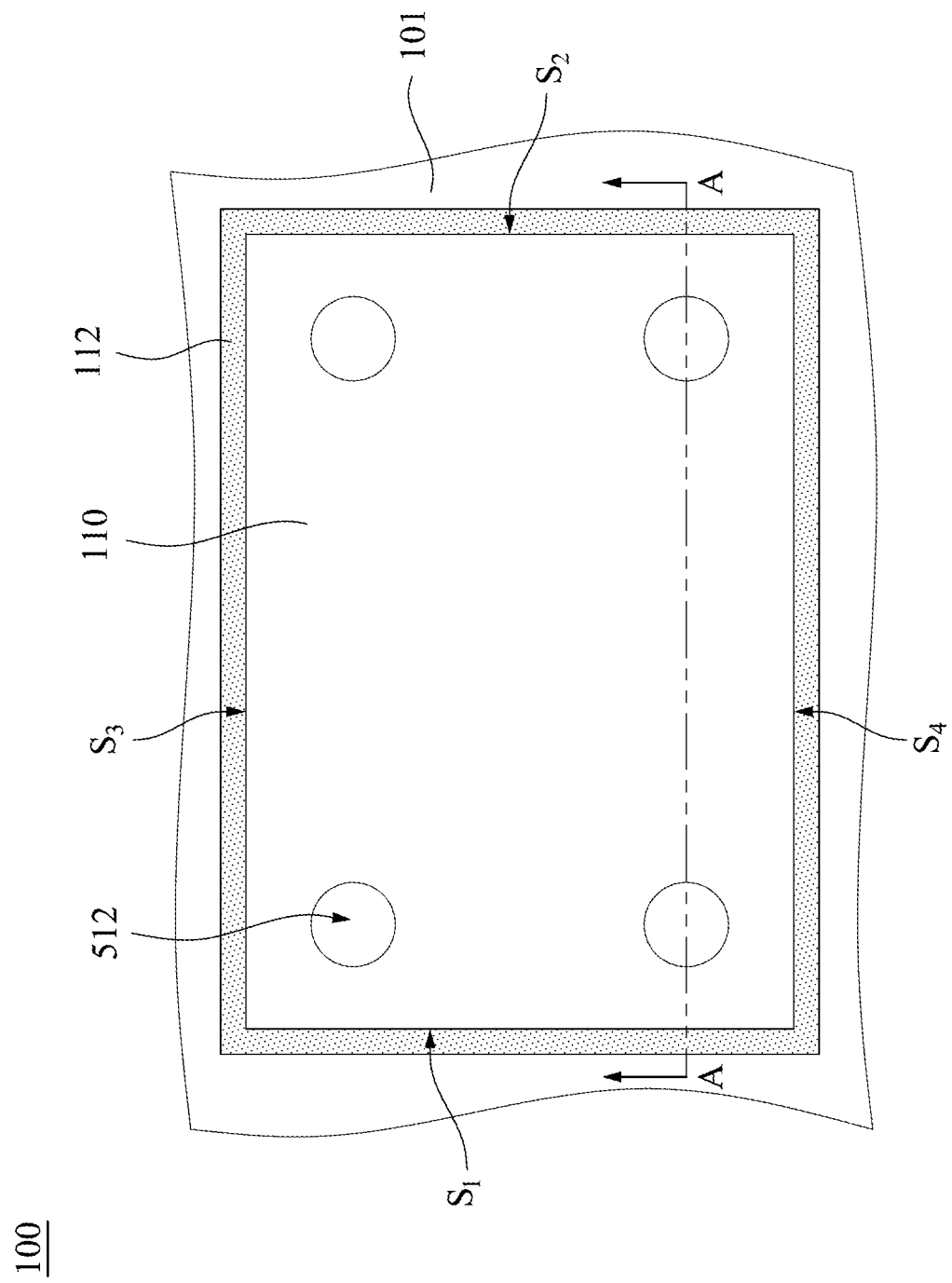
FIG. 1A is a top view of a wiring board with an embedded substrate according to some embodiments of the present disclosure.

Reference will now be made in detail to the embodiments of the present disclosure, examples of which are illustrated in the accompanying drawings. Wherever possible, the same reference numbers are used in the drawings and the description to refer to the same or like parts.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Due to different coefficients of thermal expansion (CTE), a wiring board including heterogeneous materials is susceptible to warpage in a later thermal process, reducing reliability of the wiring board. Therefore, the present disclosure presents a structure of the wiring board with an embedded interposer substrate and a method of fabricating the same.

FIG. 1A is a top view of the wiring board with the embedded substrate according to some embodiments of the present disclosure. A wiring board 100 includes a main substrate 101, an interposer substrate 110 embedded in the main substrate 101, and an underfill 112 between the main substrate and the interposer substrate. It is appreciated that the wiring board 100 in the embodiments of the present disclosure can be either a product or a semi-finished product continued in later process.

A gap between the interposer substrate and the main substrate is filled with the underfill 112. The underfill 112 entirely covers every single side surface of the interposer substrate, such as a side surface $S_1$, $S_2$, $S_3$ and $S_4$ in FIG. 1A, and a bottom surface of the interposer substrate (not shown in FIG. 1A due to a perspective of the top view). In another words, the underfill 112 surrounds the interposer substrate including the bottom surface of the interposer substrate. The interposer substrate includes at least one opening 512. In some embodiments, the opening 512 can expose a wiring layer within the interposer substrate (discuss later).

Figure 1B:
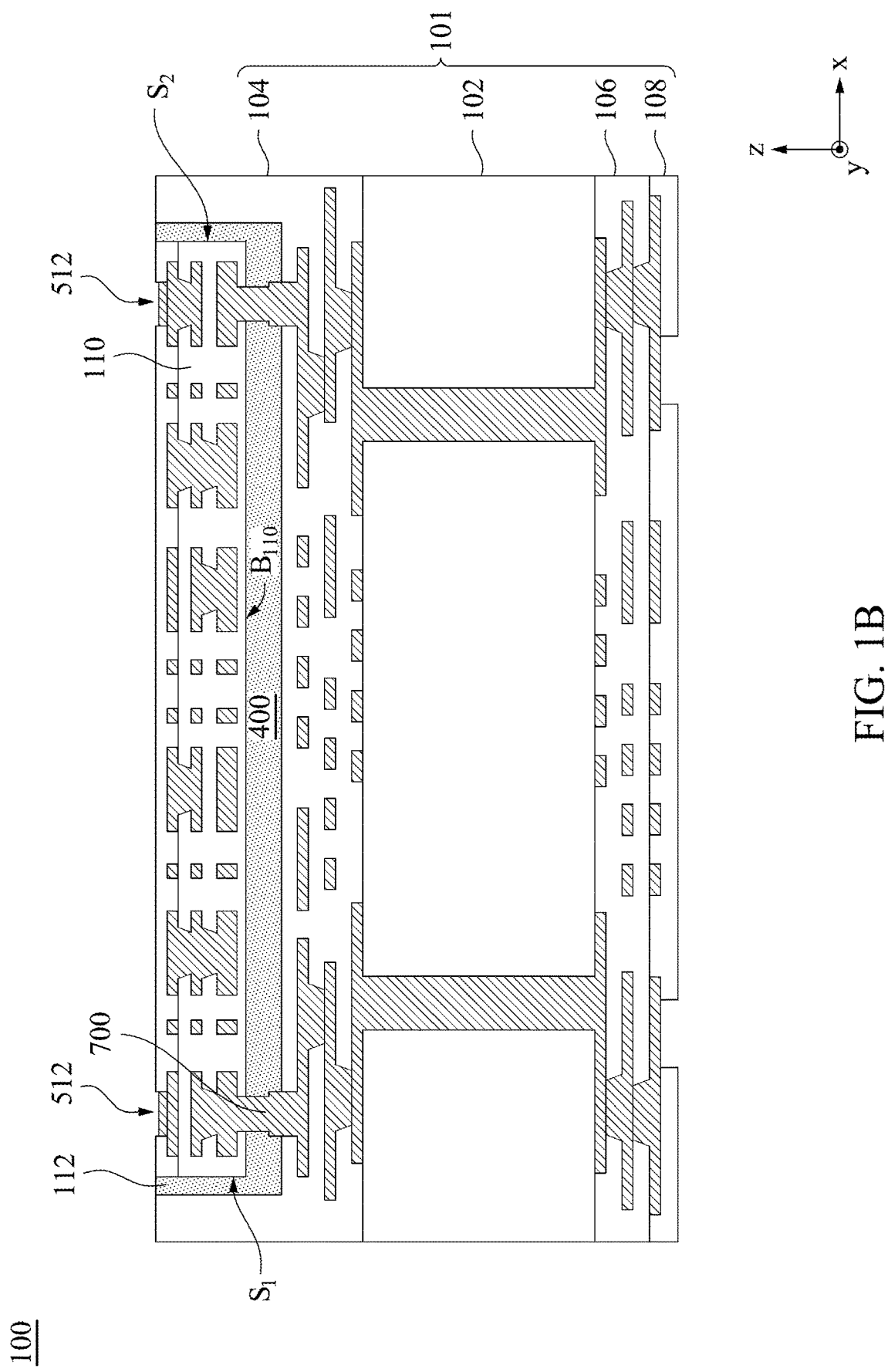
FIG. 1B is a cross-sectional view of a wiring board with an embedded substrate taken along line A-A of FIG. 1A according to some embodiments of the present disclosure.

Referring to FIG. 1B, the wiring board 100 includes the main substrate 101, the interposer substrate 110, a conductive bonding element 700, and the underfill 112. The main substrate 101 includes a core substrate 102, a build-up layer structure 104 formed on the core substrate 102, a build-up layer structure 106 formed beneath the core substrate 102, and a solder resist layer 108 formed beneath the build-up layer structure 106.

A recess 400 can be formed on the main substrate and the interposer substrate 110 is placed into the recess 400. That is, the interposer substrate 110 is embedded within the main substrate 101 through the recess 400. In some embodiments, since the recess 400 can be formed on the build-up layer structure 104, the interposer substrate 110 is embedded within the build-up layer structure 104. Therefore, the underfill 112 is disposed between a gap between the interposer substrate 110 and the build-up layer structure 104. In some other embodiments, the main substrate can be a coreless substrate, meaning the main substrate does not include the core substrate 102. It is noted that the present disclosure presents the main substrate including the core substrate 102 as an example but not a limitation.

In one perspective as shown in xz plane of FIG. 1B (e.g., the cross-sectional view taken along line A-A of FIG. 1A), the underfill 112 disposed between the interposer substrate and the main substrate can physically contact the side surface $S_1$, the side surface $S_2$ and a bottom surface $B_{110}$. Similarly, in another perspective, such as in yz plane (not shown), the underfill 112 can physically contact the side surface $S_3$, the side surface $S_4$ and the bottom surface $B_{110}$.

The core substrate 102 can include polymeric or non-polymeric dielectric materials such as, but not limited to, liquid crystal polymer (LCP), bismaleimide-triazine (BT), prepreg (PP), Ajinomoto build-up film (ABF), epoxy, polyimide (PI), or other suitable dielectric materials. The foregoing dielectric materials can be reinforced with fibers, such as glass fibers or Kevlar fibers, to strengthen the core substrate 102.

The build-up layer structure 104 and 106 can include polymeric or non-polymeric dielectric materials such as, but not limited to, LCP, BT, PP, ABF, epoxy, PI, other suitable dielectric materials, or combinations thereof. The main substrate can be a flexible substrate or rigid substrate, and therefore the wiring board 100 can be a flexible wiring board, a rigid wiring board, or a flexible-rigid wiring board.

The interposer substrate 110 can include polymeric or non-polymeric dielectric materials such as, but not limited to, LCP, BT, PP, ABF, epoxy, PI, other suitable dielectric materials, or combinations thereof. For example, a photo-imageable or photoactive dielectric material can be used to form the interposer substrate 110.

The underfill 112 can be a non-conductive material. In some embodiments, underfill 112 can be formed by a liquid encapsulant material and a curing process after the liquid encapsulant material is dispensed. In some embodiments, the liquid encapsulant material includes epoxy and suitable additives within epoxy. With fluidity of the liquid encapsulant material, the gap between the interposer substrate and the main substrate can entirely be filled with the underfill 112.

Figure 2:
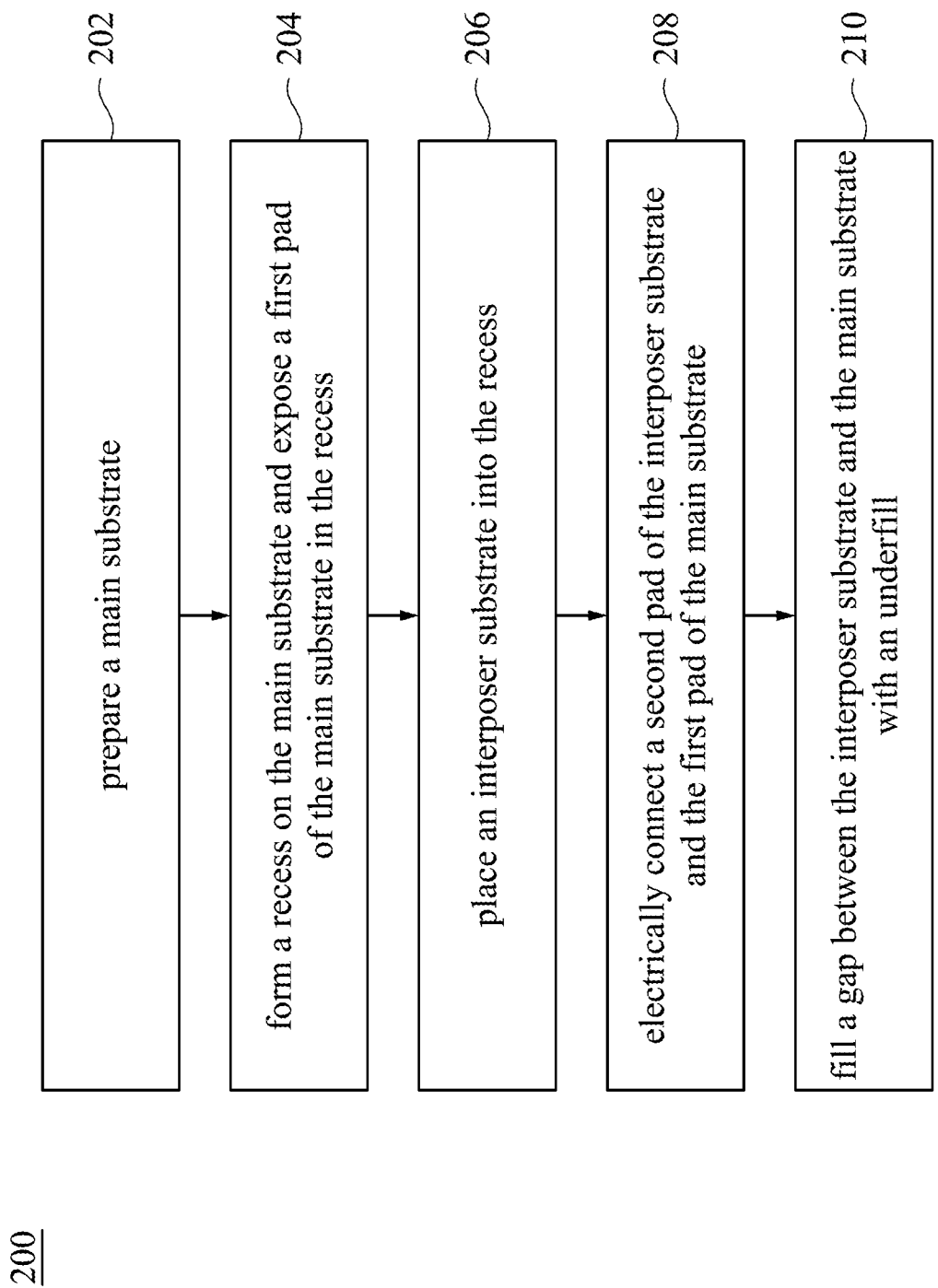
FIG. 2 is a flow diagram of a method for fabricating a wiring board with an embedded substrate according to some embodiments of the present disclosure.

Referring to FIG. 2, the present disclosure provides a method 200 of fabricating the wiring board 100 with the embedded interposer substrate 110, and FIG. 2 is a flow diagram of the method 200. FIG. 3 to FIG. 8 are cross-sectional views taken along line A-A of FIG. 1A at various process stages according to some embodiments of the present disclosure. It is understood that the wiring board 100 in the embodiments of the present disclosure can be the semi-finished product and therefore the wiring board 100 is continued in later fabrication process. Certainly, the wiring board 100 can substantially be the product. Operations in the method 200 can be performed in a different order or not performed depending on specific applications. Additional processes can be provided before, during, and/or after the method 200, and that some other processes may be briefly described herein. Further, the discussion of elements in FIG. 3 to FIG. 8 with the same annotations applies to each other, unless mentioned otherwise.

Figure 3:
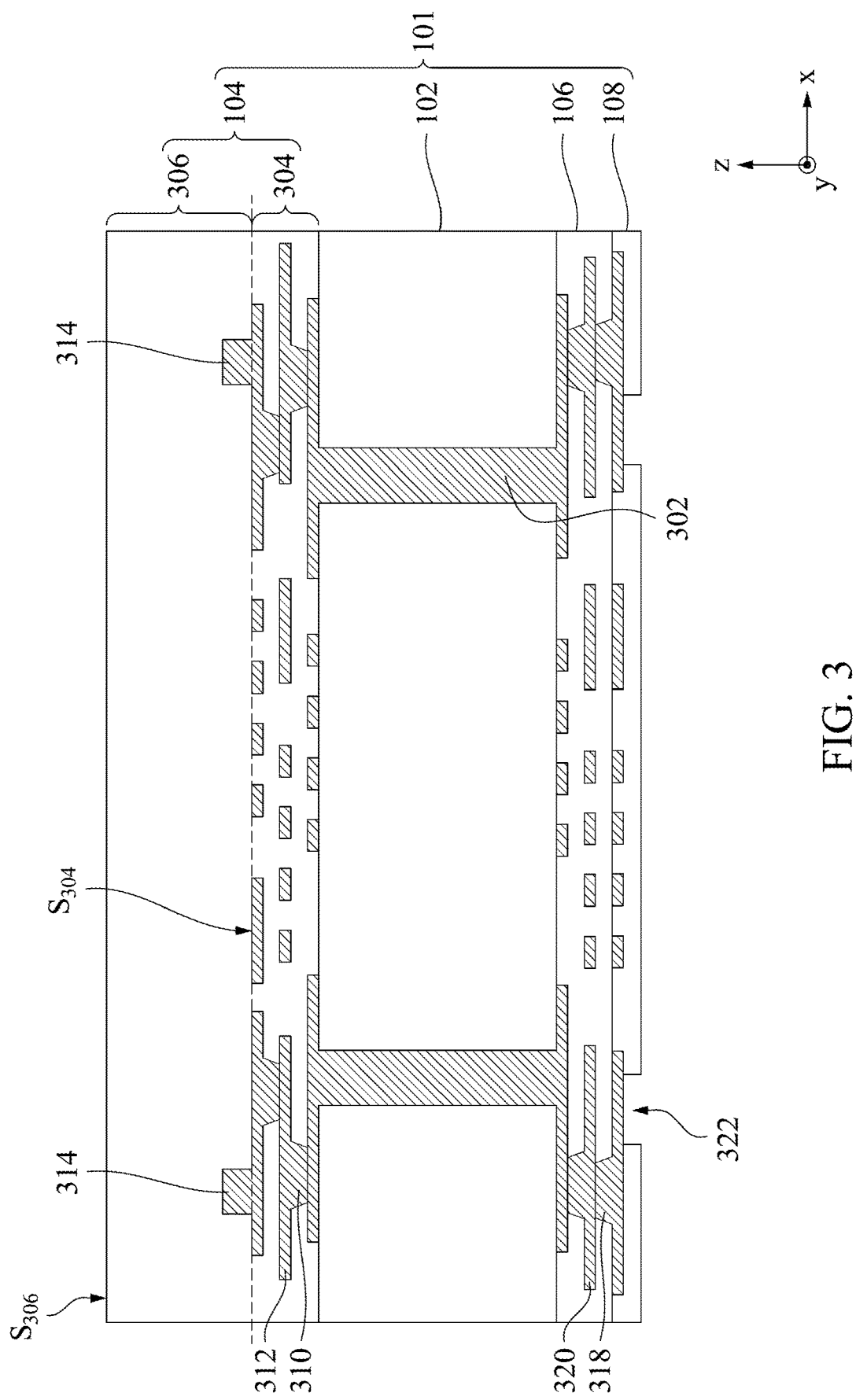
FIG. 3 is a cross-sectional view of a wiring board with an embedded substrate taken along line A-A of FIG. 1A at one of various process stages according to some embodiments of the present disclosure.

Referring to FIG. 2 and FIG. 3, firstly, the method 200 begins with operation 202 and the process of preparing the main substrate 101. The core substrate 102 within the main substrate 101 can have a plated through hole (PTH) 302 to electrically connect the build-up layer structure 104 and 106. The PTH 302 substantially is a conductive post, filled with conductive material or non-conductive material. The build-up layer structure 104 and 106 can be formed by build-up techniques or lamination techniques.

The number of layers in the build-up layer structure 104 may be adjusted according to process parameters or product design. In some embodiments, the build-up layer structure 104 has a wiring area 304 and a non-wiring area 306 disposed on the wiring area 304. The wiring area 304 touches the core substrate 102 and has a conductive post 310 and a wiring layer 312. In some embodiments, the wiring layer 312 may be a redistribution layer (RDL).

The conductive post 310 and the wiring layer 312 can be formed by metal such as aluminum (Al), gold (Au), silver (Ag), copper (Cu), tin (Sn), other suitable metal, or combinations of foregoing metals. In some embodiments, the conductive post 310 and the wiring layer 312 are formed by Cu. One or more pads 314 are configured on a top surface $S_{304}$ (i.e., an interface between the wiring area 304 and non-wiring area 306) and protrudes into the non-wiring area 306. One end of the pad 314 electrically connects the wiring layer 312, and the other end of the pad 314, in later process, may electrically connect other components (discuss later). The pad 314 can be formed by metal such as Al, Au, Ag, Cu, Sn, other suitable metal, or combinations of foregoing metals. In some embodiments, the pad 314 is formed by Cu. The wiring in the wiring area 304 can be formed by a subtractive process, a semi-additive process or an additive process.

The number of layers in the build-up layer structure 106 may be adjusted according to process parameters or product design. The build-up layer structure 106 has a conductive post 318 and a wiring layer 320. In some embodiments, the wiring layer 320 may be a RDL. The conductive post 318 and the wiring layer 320 can be formed by metal such as Al, Au, Ag, Cu, Sn, other suitable metal, or combinations of foregoing metals. In some embodiments, the conductive post 318 and the wiring layer 320 are formed by Cu.

The solder resist configured beneath the build-up layer structure 106 includes an opening 322 where the wiring layer 320 of the build-up layer structure 106 is exposed. The wiring layer 320 may electrically connect one or more electronic components, such as at least of active or passive components, through the opening 322.

Figure 4:
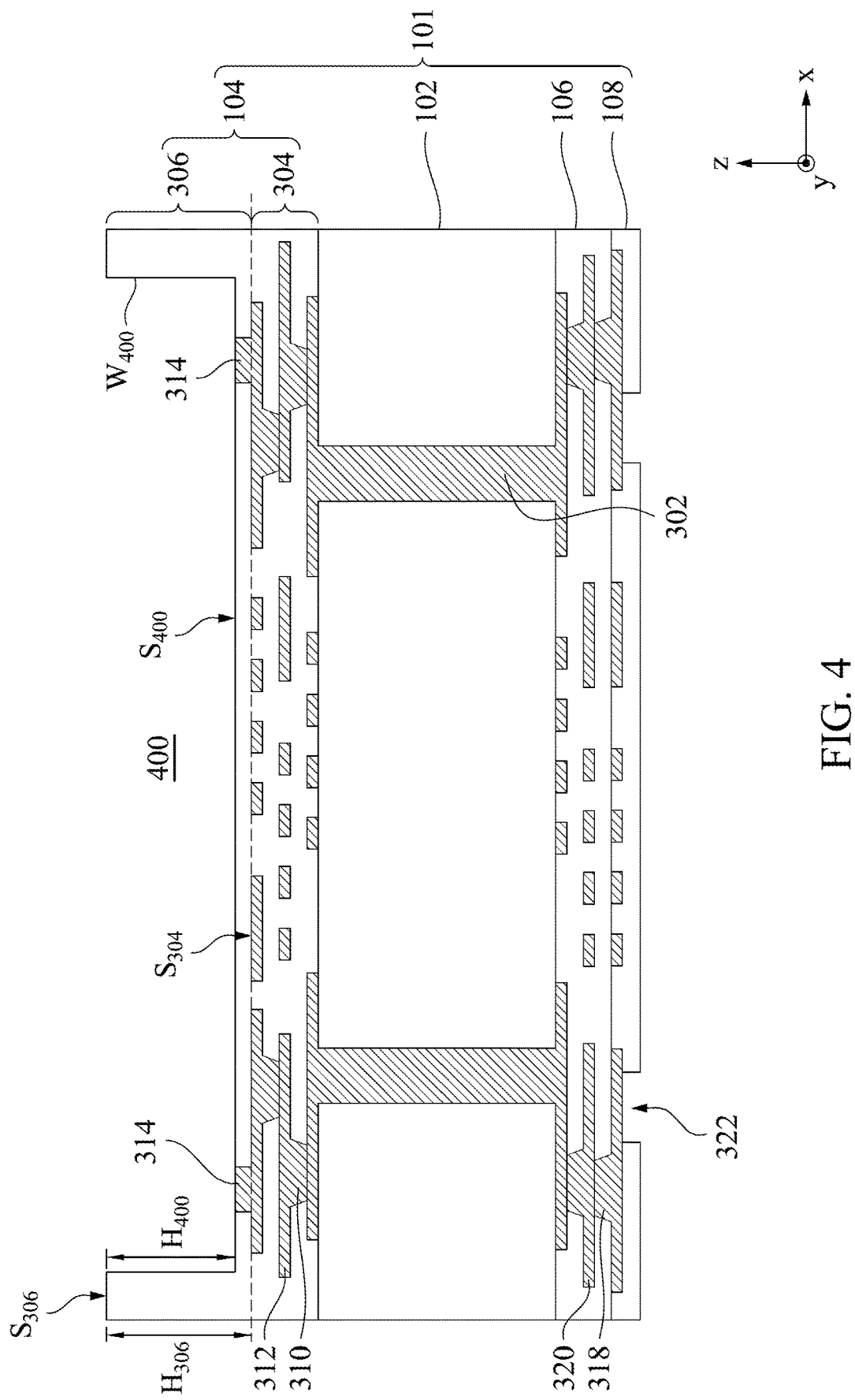
FIG. 4 is a cross-sectional view of a wiring board with an embedded substrate taken along line A-A of FIG. 1A at one of various process stages according to some embodiments of the present disclosure.

Referring to FIG. 2 and FIG. 4, the method 200 continues with operation 204 and the process of forming a recess 400 on the main substrate 101, and the pad 314 of the main substrate 101 is exposed in the recess 400. In some embodiments as shown in FIG. 4, the recess 400 can be formed in the non-wiring area 306 of the build-up layer structure 104 to result in an exposure of the pad 314. A formation of the recess 400 can be performed by a laser process drilling process or mechanical process, such as a mechanical drilling process with drill bits or a routing process.

After the formation of the recess 400, a bottom surface $S_{400}$ of the recess 400 and sidewalls $W_{400}$ of the recess 400 are shown in the non-wiring area 306. The pad 314 is exposed on the bottom surface $S_{400}$ of the recess 400. The sidewalls $W_{400}$ extends upwards (e.g., z directions) from the bottom surface $S_{400}$ and is a continuous wall surrounding the recess 400. A thickness $H_{400}$ of the recess 400 may be defined as a distance between the bottom surface $S_{400}$ of the recess 400 and a top surface $S_{306}$ of the non-wiring area 306.

The thickness H400 of the recess 400 is smaller than a thickness $H_{306}$ of the non-wiring area 306 (e.g., a distance between the top surface $S_{304}$ of the wiring area 304 and the top surface $S_{306}$ of the non-wiring area 306). Accordingly, a remaining portion of non-wiring area 306 (e.g., the bottom surface $S_{400}$ of the recess 400) covers the top surface $S_{304}$ of the wiring area 304 and the wiring layer 312. The exposed pad 314 in the recess 400 may electrically connect other components (not shown), such as, but not limited to, active or passive components.

Figure 5:
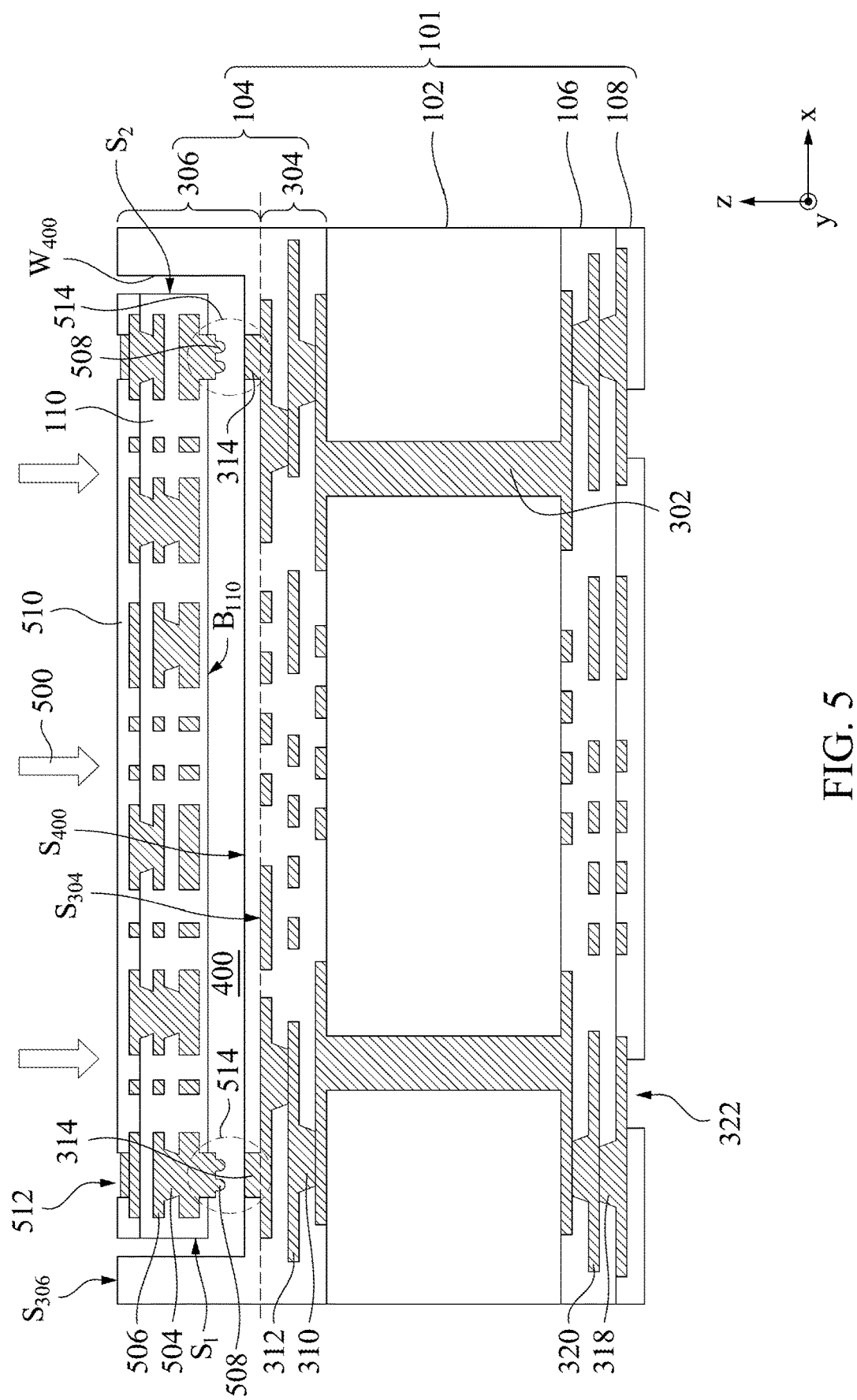
FIG. 5 is a cross-sectional view of a wiring board with an embedded substrate taken along line A-A of FIG. 1A at one of various process stages according to some embodiments of the present disclosure.

Referring to FIG. 2 and FIG. 5, the method 200 continues with operation 206 and the process of placing the interposer substrate 110 into the recess 400. As shown in FIG. 5, the interposer substrate is moved downward along z direction (e.g., a direction 500) and is placed within the recess 400. A gap is between the interposer substrate and the main substrate.

The interposer substrate may include at least one conductive post 504 and at least one wiring layer 506. In some embodiments, the wiring layer 506 may be a RDL. The conductive post 504 and the wiring layer 506 can be formed by metal such as Al, Au, Ag, Cu, Sn, other suitable metal, or combinations of foregoing metals. In some embodiments, the conductive post 504 and the wiring layer 506 are formed by Cu.

The interposer substrate includes a pad 508 which is exposed at the bottom surface $B_{110}$ of the interposer substrate. In some embodiments, the pad 508 is configured in alignment with where the pad 314 is configured. In other words, the pad 508 physically contacts the corresponding pad 314 after the interposer substrate is placed within the recess 400.

The pad 508 can be made of metal such as Al, Au, Ag, Cu, Sn, other suitable metal, or combinations of foregoing metals. In some embodiments, the pad 508 can be made of Cu. The pad 508 and the pad 314 are made of the same metal. For example, the pad 508 and the pad 314 are made of Cu. Moreover, FIG. 6A to FIG. 6E are an enlarged view of a portion of FIG. 5 according to some embodiments to illustrate an outer surface profile of the pad 508 and the pad 314 respectively.

In some embodiments of the interposer substrate including a protection layer 510, the protection layer is disposed at opposite side of the pad 508 and has the opening 512 where the wiring layer 506 of the interposer substrate is exposed. The wiring layer 506 may electrically connect one or more electronic components (not shown), such as chip, through the opening 512. In some embodiments, the protection layer 510 can be formed by solder resist materials.

FIG. 6A to FIG. 6E are the enlarged view of a portion of FIG. 5 according to some embodiments to illustrate the outer surface profile of the pad 508 and the pad 314 respectively. The pad 508 and pad 314 have different outer surface profiles to each other. In some embodiments where the pad 508 and the pad 314 are made of Cu, at least one of the pad 508 and the pad 314 comprises an undulating outer surface profile. Consequently, in the very beginning of the pad 508 physically contacting the pad 314, a stress concentrated area is formed due to a direct contact between part of an outer surface of the pad 508 and part of an outer surface of the pad 314. The undulating outer surface profile may include an outer surface profile with at least one bump, a recessed outer surface profile, other suitable outer surface profile, or combinations thereof. The undulating outer surface profile can be formed by adjusting parameters in an electroplating process, in a lithography process, in an etching process or other applicable processes.

Figure 6C:
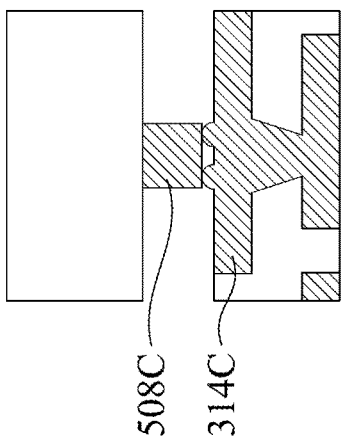
FIG. 6A to FIG. 6E are an enlarged view of a portion of FIG. 5 according to some embodiments of the present disclosure.
Figure 6B:
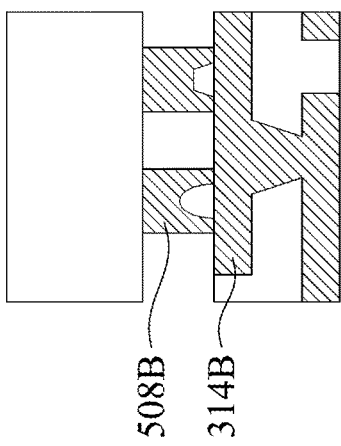
Figure 6E:
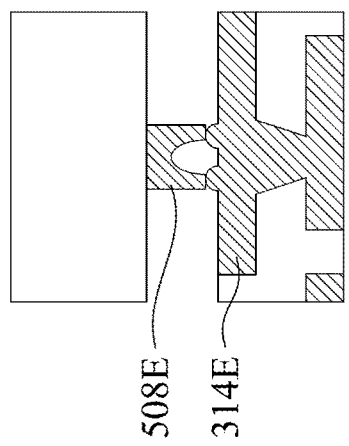
Figure 6A:
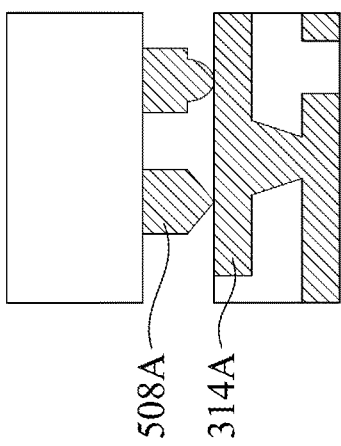
Figure 6D:
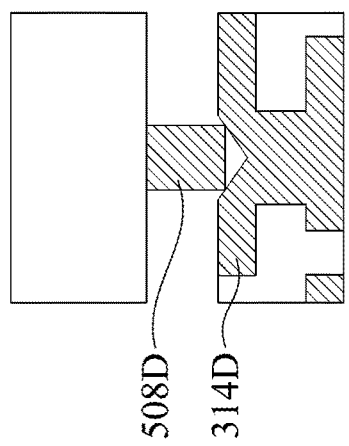

FIG. 6A illustrates that a pad 508A includes an outer surface profile with a bump and a pad 314A includes a flat outer surface. FIG. 6B illustrates that a pad 508B includes a recessed outer surface profile and a pad 314B includes the flat outer surface profile. FIG. 6C illustrates that a pad 508C includes the flat surface profile and a pad 314A includes an outer surface profile with multiple bumps. FIG. 6D illustrates that a pad 508D includes the flat outer surface profile and a pad 314D includes the recessed outer surface profile. In some embodiments, an end of the pad 508D can be configured within the recessed outer surface profile of the pad 314D due to a width of the recessed outer surface profile of the pad 314D larger than a width of the end of the pad 508D. FIG. 6D illustrates that a pad 508D includes the flat outer surface profile and a pad 314D includes the recessed outer surface profile. FIG. 6E illustrates that a pad 508E includes the recessed outer surface profile and a pad 314E includes the surface profile with bumps. In some embodiments, top edges of the recessed outer surface profile of the pad 508E face toward the bumps of the pad 314E. The foregoing outer surface profiles of the pad 508 and the pad 314 can be interchangeable.

At least one of the pad 508 and the pad 314 comprises the undulating outer surface profile so that the stress concentrated area is formed due to the direct contact between part of the outer surface of the pad 508 and part of the outer surface of the pad 314 in the very beginning of the pad 508 physically contacting the pad 314. Based on the disclosure herein, other outer surface profiles for forming the pad 508 and the pad 314 are within the spirit and scope of this disclosure.

Figure 7:
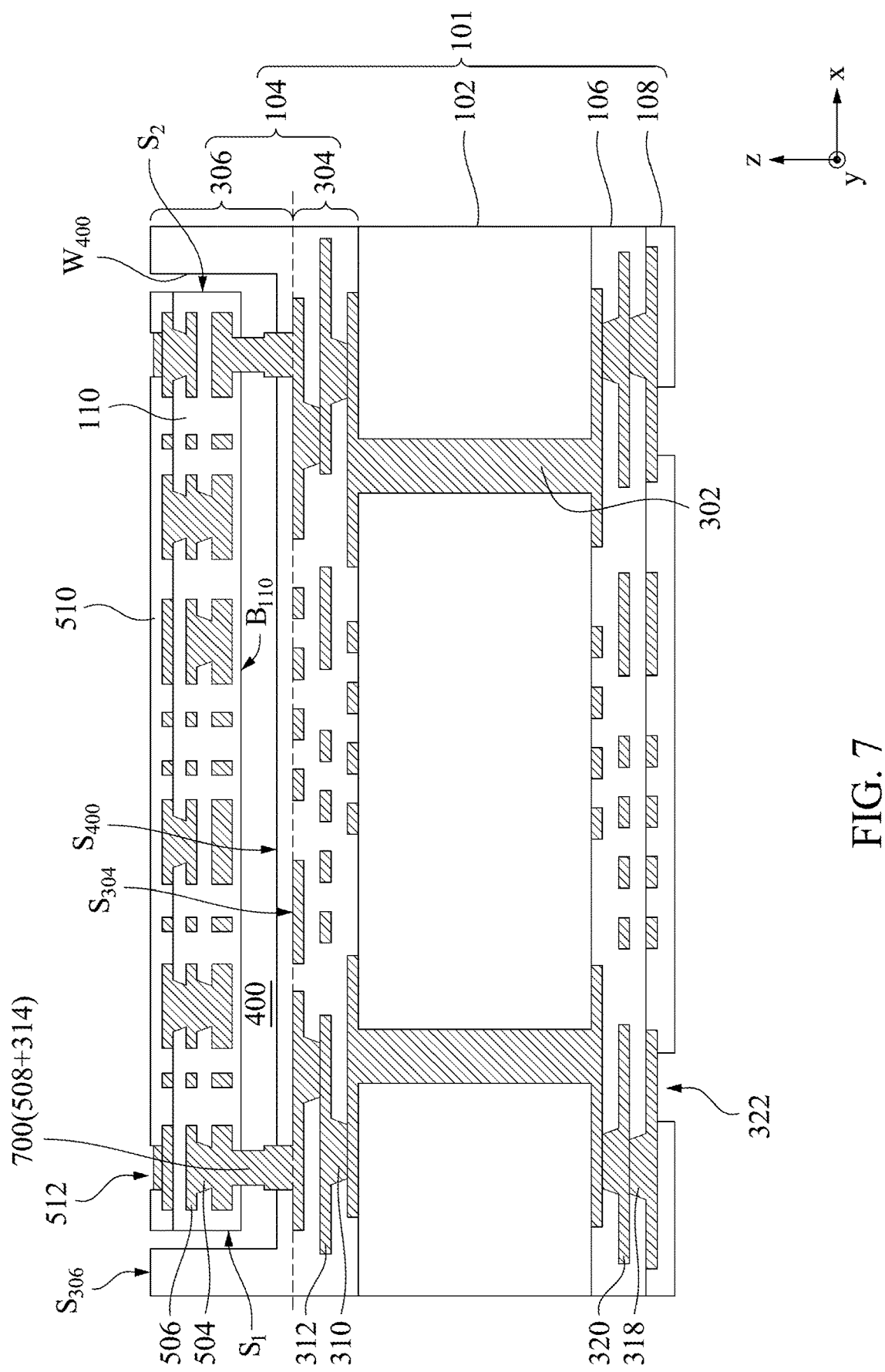
FIG. 7 is a cross-sectional view of a wiring board with an embedded substrate taken along line A-A of FIG. 1A at one of various process stages according to some embodiments of the present disclosure.

Referring to FIG. 2 and FIG. 7, the method 200 continues with operation 208 and the process of electrically connecting the pad 508 of the interposer substrate 110 and the pad 314 of the main substrate 101. A bonding of the pad 508 and the pad 314 forms a conductive bonding element 700 between the main substrate 101 and the interposer substrate 110. The formation of the conductive bonding element 700 can includes a direct metal bonding process, an eutectic bonding process, or other suitable processes. In some embodiments, the conductive bonding element 700 can be a metal post, such as Cu post.

In some embodiments where the pad 508 and the pad 314 are made of Cu, a direct Cu to Cu bonding process, a thermal compressive Cu bonding process or other suitable processes can be applied to electrically connect the pad 508 and the pad 314. In some embodiments of the thermal compressive Cu bonding process, a force exerted onto the interposer substrate 110 or the main substrate 101 results in a stress area during a physical contact of the pad 508 and the pad 314. A solid state diffusion occurs in the stress area. Thus, during a physical contact of the pad 508 and the pad 314, an inter-diffusion of atoms and grain growth cause the pad 508 and the pad 314 to bond together and form the conductive bonding element 700.

With a predetermined outer surface profile, such as at least one of the pad 508 and the pad 314 having the undulating outer surface profile, stress can be concentrated in a smaller area to form the stress concentrated area in the very beginning of the pad 508 physically contacting the pad 314. A concentrated stress can destroy an impurity, such as native oxide, attached on the pad 508 or the pad 314. Therefore, the bonding of the pad 508 and the pad 314 to form a conductive bonding element 700 is a homogeneous structure without a void, a seam or a crack inside.

In some embodiments with the predetermined outer surface profile of the pad 508 and the pad 314, a bonding temperature used in the thermal compressive Cu bonding process is between about 60° C. and about 160° C. For example, the bonding temperature may be about 60, 70, 80, 90, 100, 110, 120, 130, 140, 150, or 160° C. A more suitable bonding temperature is about 80, 100 or 120° C.

In some embodiments, the thermal compressive Cu bonding process can be performance at 80° C. and one atmosphere for 70 minutes to effectively bond the pad 508 and the pad 314 together and form the conductive bonding element 700 with a preferable conductivity. In some embodiments, the thermal compressive Cu bonding process can be performance at 60° C. and one atmosphere for 10 minutes. In some embodiments, the thermal compressive Cu bonding process can be performance at 160° C. and one atmosphere for 10 minutes. It is noted that the resulted conductive bonding element 700 may have a low conductivity when the bonding temperature is below 60° C. Similarly, the resulted conductive bonding element 700 may have an unnecessary thermal budge inside when the bonding temperature is higher than 160° C.

Figure 8:
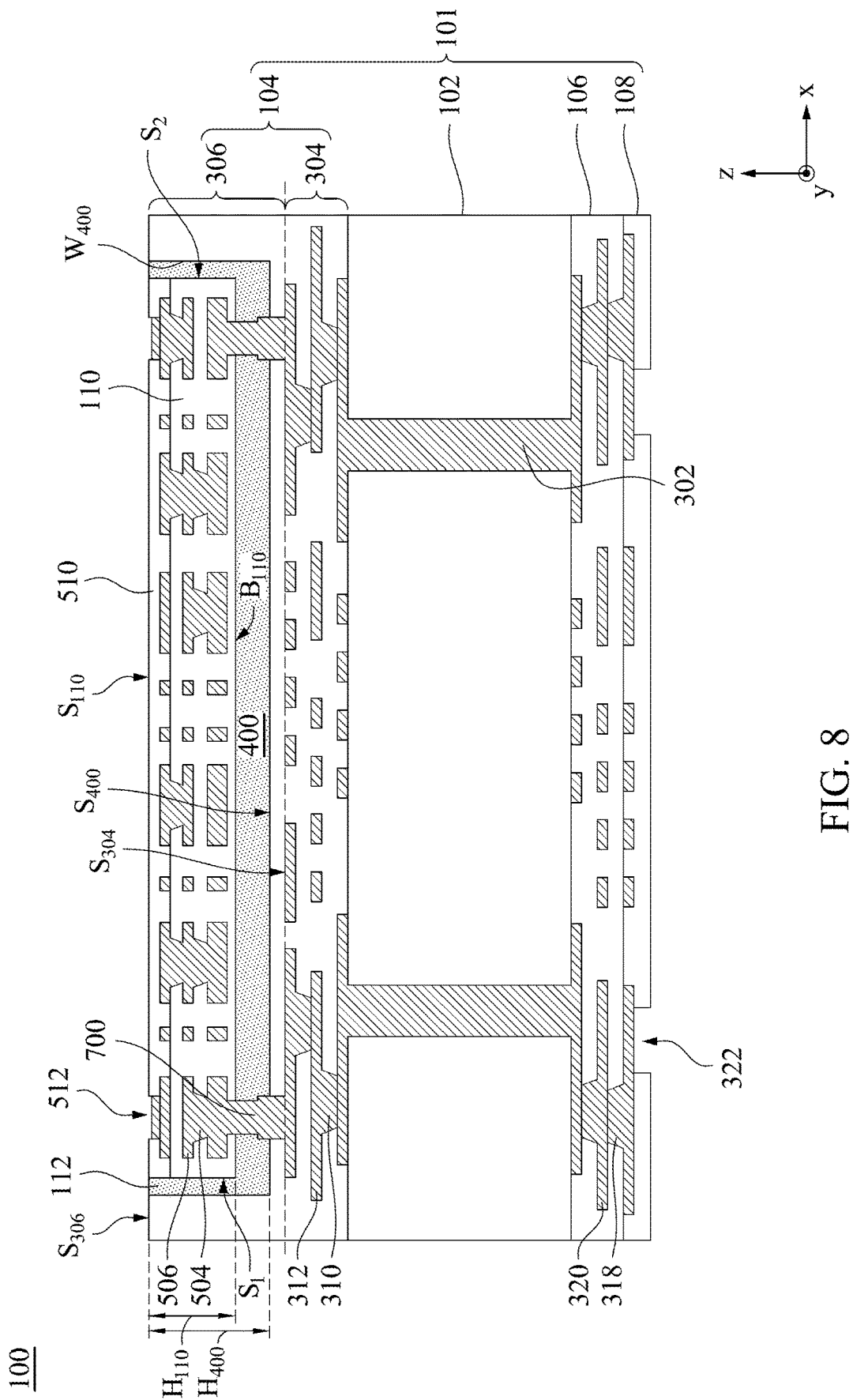
FIG. 8 is a cross-sectional view of a wiring board with an embedded substrate taken along line A-A of FIG. 1A at one of various process stages according to some embodiments of the present disclosure.

Referring to FIG. 2 and FIG. 8, the method 200 continues with operation 210 and the process of filling the gap between the interposer substrate 110 and the main substrate 101 with the underfill 112. For example, as shown in xz plane of FIG. 8 (e.g., the cross-sectional view taken along line A-A of FIG. 1A), the underfill 112 is dispensed into the recess 400 and entirely touches the side surface $S_1$, the side surface $S_2$ and the bottom surface $B_{110}$ of the interposer substrate 110. Also, the underfill 112 touches the bottom surface $S_{400}$ of the recess 400 and sidewalls $W_{400}$ of the recess 400. The underfill 112 laterally connects the side surfaces $S_1$, $S_2$, $S_3$ and $S_4$ ($S_3$ and $S_4$ not shown in FIG. 8 due to a perspective of xz plane) of the interposer substrate 110 and the main substrate 101. With fluidity of the liquid encapsulant material, the gap between the interposer substrate and the main substrate can entirely be filled with the underfill 112.

In some embodiments, with fluidity of the underfill 112, the gap between the interposer substrate and the main substrate can entirely be filled with the underfill 112. Then, a curing process is performed to cure the underfill 112.

In some embodiments, the recess 400 is fully filled with the underfill 112 and therefore a height of the underfill 112 substantially equals to the thickness $H_{400}$ of the recess 400.

After the interposer substrate is placed within the main substrate, a top surface $S_{110}$ of the interposer substrate can be coplanar with or lower than the top surface $S_{306}$ of the non-wiring area 306. In some embodiments where the top surface $S_{110}$ of the interposer substrate is higher than the top surface $S_{306}$ of the non-wiring area 306, a planarization process or a polish process may be conducted on the interposer substrate in order to lower the thickness $H_{110}$ of the interposer substrate. As a result, the top surface $S_{110}$ of the interposer substrate can be coplanar with the top surface $S_{306}$ of the non-wiring area 306 after the planarization process or the polish process.

The foregoing outlines a gap between an interposer substrate and a main substrate is filled with an underfill covering every side surface and a bottom surface of the interposer substrate. Therefore, the interposer can be firmly configured within the main substrate by the underfill to form a wiring board with the embedded interposer substrate. The underfill can provide support to avoid the interposer from damage due to warpage in a later thermal process such as reflow process. The embedded interposer substrate can be protected by the main substrate against damage caused by collision. Furthermore, with a predetermined outer surface profile, a bonding temperature used in a thermal compressive copper bonding process can be decreased. With the bonding temperature below 200° C. (e.g., between about 60° C. and about 160° C.), a negative impact of thermal budget on the wiring board can be eliminated.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of fabricating a wiring board with an embedded interposer substrate, comprising:
 preparing a main substrate;
 forming a recess on the main substrate, wherein a first pad of the main substrate is exposed in the recess;

placing an interposer substrate into the recess, wherein a second pad of the interposer substrate and the first pad are made of the same metal and formed in different outer surface profiles;

electrically connecting the second pad of the interposer substrate and the first pad of the main substrate;

filling a gap between the interposer substrate and the main substrate with an underfill, wherein the underfill entirely touches side surfaces and a bottom surface of the interposer substrate; and performing a planarization process such that a top surface of the interposer substrate, a top surface of the underfill, and a top surface of the main substrate are coplanar with each other.

2. The method of claim 1, wherein the first pad is made of copper.

3. The method of claim 1, wherein at least one of the first pad and the second pad comprises an undulating outer surface profile.

4. The method of claim 3, wherein one of the first pad and the second pad comprises an outer surface profile with a bump, and the other of the first pad and the second pad comprises a flat outer surface profile.

5. The method of claim 3, wherein one of the first pad and the second pad comprises a recessed outer surface profile, and the other of the first pad and the second pad comprises a flat outer surface profile.

6. The method of claim 3, wherein one of the first pad and the second pad comprises an outer surface profile with a plurality of bumps, and the other of the first pad and the second pad comprises a flat outer surface profile.

7. The method of claim 3, wherein one of the first pad and the second pad comprises a recessed outer profile, wherein the other of the first pad and the second pad is configured within the recessed outer profile.

8. The method of claim 3, wherein one of the first pad and the second pad comprises a recessed outer surface profile, and the other of the first pad and the second pad comprises an outer surface profile with a plurality of bumps, wherein a plurality of top edges of the recessed outer surface profile face toward the plurality of bumps.

9. The method of claim 1, wherein electrically connecting the second pad of the interposer substrate and the first pad of the main substrate comprising operating a thermal compressive copper bonding process.

10. The method of claim 9, wherein part of an outer surface of the first pad and part of an outer surface of the second pad touch each other before operating the thermal compressive copper bonding process.

11. The method of claim 10, wherein a bonding temperature used in the thermal compressive copper bonding process is between about 60° C. and about 160° C.

12. The method of claim 1, wherein the underfill laterally connects side surfaces of the interposer substrate and the main substrate.

13. The method of claim 1, wherein a height of the underfill substantially equals to a thickness of the interposer substrate.

14. The method of claim 1, wherein a curing process is performed on the underfill after filling the gap between the interposer substrate and the main substrate with the underfill.

15. A wiring board with an embedded interposer substrate, comprising:

a main substrate, comprising a recess formed on the main substrate;

an interposer substrate placed into the recess, comprising:
a bottom surface; and
a plurality of side surfaces;

a conductive bonding element between the main substrate and the interposer substrate, wherein the conductive bonding element electrically connects the main substrate and the interposer substrate; and an underfill between the main substrate and the interposer substrate, wherein the underfill entirely touches side surfaces and a bottom surface of the interposer substrate, and wherein a top surface of the interposer substrate, a top surface of the underfill, and a top surface of the main substrate are coplanar with each other.

16. The wiring board of claim 15, wherein the conductive bonding element is made of copper.

17. The wiring board of claim 15, wherein the conductive bonding element is a homogeneous structure without voids inside.

18. The wiring board of claim 15, wherein the underfill laterally connects side surfaces of the interposer substrate and the main substrate.

19. The wiring board of claim 15, wherein a height of the underfill substantially equals to a thickness of the interposer substrate.

20. The wiring board of claim 15, wherein a coefficient of thermal expansion (CTE) of the main substrate is different from one of a CTE of the interposer substrate and a CTE of the underfill.

* * * * *